United States Patent
Okada et al.

(10) Patent No.: US 8,451,260 B2
(45) Date of Patent: May 28, 2013

(54) DRIVER CIRCUIT CONTROLLING THRESHOLD VOLTAGE SHIFT OF TRANSISTOR

(75) Inventors: Yuki Okada, Tama (JP); Mitsuru Goto, Chiba (JP); Takahiro Ochiai, Chiba (JP); Naoki Takada, Yokohama (JP); Youzou Nakayasu, Mobara (JP)

(73) Assignees: Hitachi Displays, Ltd., Chiba (JP); Panasonic Liquid Crystal Display Co., Ltd., Hyogo-Ken (JP)

( * ) Notice: Subject to any disclaimer, the term of this patent is extended or adjusted under 35 U.S.C. 154(b) by 484 days.

(21) Appl. No.: 12/822,661

(22) Filed: Jun. 24, 2010

(65) Prior Publication Data
US 2010/0328281 A1 Dec. 30, 2010

(30) Foreign Application Priority Data
Jun. 26, 2009 (JP) ................. 2009-152669

(51) Int. Cl.
*G06F 3/038* (2006.01)
(52) U.S. Cl.
USPC .............................. 345/206; 345/92; 377/75
(58) Field of Classification Search
None
See application file for complete search history.

(56) References Cited

U.S. PATENT DOCUMENTS

| | | | |
|---|---|---|---|
| 6,690,347 B2 * | 2/2004 | Jeon et al. | 345/100 |
| 6,845,140 B2 * | 1/2005 | Moon et al. | 377/78 |
| 7,406,147 B2 * | 7/2008 | Lo et al. | 377/64 |
| 7,443,944 B2 * | 10/2008 | Tobita et al. | 377/64 |
| 2002/0150199 A1 | 10/2002 | Sasaki et al. | |
| 2005/0220263 A1 | 10/2005 | Moon | |
| 2008/0123799 A1 | 5/2008 | Otose | |

FOREIGN PATENT DOCUMENTS
JP 2005-293817 10/2005

* cited by examiner

*Primary Examiner* — Jason Olson
(74) *Attorney, Agent, or Firm* — Antonelli, Terry, Stout & Kraus, LLP.

(57) ABSTRACT

Each shift register includes a first element controlled by a first potential node to supply a first driving voltage to an output terminal, a second element controlled by a second potential node to supply a second driving voltage lower than the first driving voltage to the output terminal, and a third element for controlling the first potential node and the second potential node so as to have opposite potential levels. Voltages are applied to the third element so that a state of A>B and A>C and a state of A<B and A<C, or a state of A>B and A<C and a state of A<B and A>C, or a state of A<B and A>C and a state of A>B and A<C are switched alternately (A: a gate terminal of the third element, B: a voltage applied to a first terminal thereof, C: a voltage applied to a second terminal thereof).

8 Claims, 13 Drawing Sheets

DRIVER CIRCUIT CONTROLLING THRESHOLD VOLTAGE SHIFT OF TRANSISTOR

CLAIM OF PRIORITY

The present application claims priority from Japanese patent application JP 2009-152669 filed on Jun. 26, 2009, the content of which is hereby incorporated by reference into this application.

BACKGROUND OF THE INVENTION

1. Field of the Invention

The present invention relates to a display apparatus, and more particularly, to a shift register circuit possessed by a scanning signal line driver circuit such as liquid-crystal display (LCD).

2. Description of the Related Art

Hitherto, thin-film transistors (TFTs) using polysilicon (p-Si) were the major TFTs used in small-size LCDs which are mounted on portable information processing devices such as cellular phones. In recent years, however, TFT-LCDs using amorphous silicon (a-Si) which is non-crystalline silicon have been developed in order to decrease a mounting cost. Moreover, in order to reduce the area of a non-display portion in the a-Si TFT-LCD, there is proposed a structure having shift registers in which a shift register circuit for scanning a gate line is integrated and mounted at the same time as TFTs of a pixel unit.

A shift register circuit using a-Si TFTs is disclosed in JP 2005-293817 A, for example. The shift register circuit has a plurality of stages, and each stage includes: a pull-up transistor controlled by a first node to supply a first clock signal to an output line; a pull-down transistor controlled by a second node to supply a first driving voltage to the output line; a controller for controlling the first and second nodes so as to have opposite potential levels; and a compensating capacitor connected between the first node and an input line of a second clock signal so as to compensate for a fluctuation amount caused by parasitic capacitors among the first node, the first clock signal, and the pull-up transistor.

FIG. 18 shows a part of a detailed circuit of one stage of a plurality of stages which is subordinately connected in a shift register according to the related art. A gate output operation according to the related art will be described for the following three steps with reference to FIG. 18.

First, in the first step, a high voltage of a start pulse (VST) is supplied in synchronization with a voltage of a clock signal (/C1). The high voltage of the clock signal (/C1) turns on a transistor (T1), and the high voltage of the start pulse (VST) is supplied to a node Q, namely the node Q is precharged. The precharged high voltage at the node Q turns on a transistor (T5), and the transistor (T5) supplies a low voltage of a clock signal (C1) to an output line. At that time, the high voltage of the second clock signal (/C1) also turns on a transistor (T2), and a high-level voltage (VDD) is supplied to a node QB. The high-level voltage (VDD) supplied to the node QB also turns on a transistor (T6), and the transistor (T6) outputs a low-level voltage (VSS). Here, the high-level voltage (VDD) and the low-level voltage (VSS) always maintain a constant voltage. In this way, during the first period A, the stage outputs a low-state output signal (OUT) from the output line.

In the second step, a low voltage of the clock signal (/C1) turns off the transistor (T1) and the node Q floats in the high state. Thus, the transistor (T5) maintains the on state. At that time, the high voltage is supplied to the clock signal (C1), whereby the floating node Q is bootstrapped by an effect of a parasitic capacitor (CGS) which is formed between a gate electrode and a source electrode of the transistor (T5). Accordingly, the voltage at the node Q rises further, the transistor (T5) is completely turned on, and the high voltage of the clock signal (C1) is supplied quickly to the output line. In addition, the transistor (T4) is turned on by the voltage of the node Q floating in the high state, and the transistor (T3) is turned on by the high-state clock signal (C1). Thus, the low-level voltage (VSS) is supplied to the node QB, and the transistor (T6) is turned off. In this way, during the second period B, the stage outputs a high-state output signal (OUT) from the output line.

In the third step, the high voltage of the clock signal (/C1) turns on the transistor (T1) and the low voltage of the start pulse (VST) is supplied to the node Q. Thus, the transistor (T5) is turned off. At that time, the high voltage of the clock signal (/C1) turns on the transistor (T2), and the high-level voltage (VDD) is supplied to the node QB. Thus, the transistor (T6) is turned on, and the low-level voltage (VSS) is output to the output line. At that time, the transistor (T3) is turned off by the low voltage of the clock signal (C1), and the transistor (T4) is turned off by the low voltage of the node Q. Thus, the high-level voltage (VDD) is maintained at the node QB. In this way, during the third period C, the stage outputs a low-state output signal (OUT) from the output line.

Through the operation steps, the gate output signal is output. However, in the second step, since the high voltage raised by the bootstrapping is applied to the gate of the transistor T4, a shift of the threshold voltage of the transistor T4 is accelerated in a direction of increasing the threshold voltage.

In particular, when the shift of the threshold voltage of the transistor T4 is accelerated in the direction of increasing the threshold voltage due to the threshold voltage shifting characteristics, there is a problem in that the driving capability to supply the low-level voltage (VSS) to the node QB decreases, and the node QB floats in the high level. When the node QB is in the high state, the transistor (T6) is turned on. Thus, the output signal (OUT) which is originally in the high state is pulled down to the low state. As a result, there is a problem in that the output signal (OUT) disappears, thus causing display errors.

SUMMARY OF THE INVENTION

The present invention has been made to solve the problems described above, and an object of the present invention is to provide a display apparatus capable of reducing a shift amount of the threshold voltage of a transistor that constitutes a scanning signal line driver circuit and obtaining a proper scanning signal.

In order to solve the problems, according to an aspect of the present invention, there is provided a display apparatus which includes a display panel which includes a plurality of video signal lines, a plurality of scanning signal lines intersecting the video signal lines, and a thin-film transistor which is formed near each intersection of the scanning signal lines and the video signal lines, in which a pixel region is defined in a region surrounded by a pair of adjacent scanning signal lines and a pair of adjacent video signal lines; and a scanning signal line driver circuit which is formed on the same board as the display panel so as to sequentially apply a select signal to the scanning signal lines, wherein the scanning signal line driver circuit is connected to a plurality of shift registers that outputs an output signal, which is obtained by shifting a start pulse, as a start pulse of a next stage, each of the shift registers including a first element controlled by a first potential node to supply a first driving voltage to an output terminal, a second element controlled by a second potential node to supply a second driving voltage lower than the first driving voltage to the output terminal, and a third element for controlling the first potential node and the second potential node so as to have opposite potential levels, and wherein when it is assumed that a voltage applied to a gate terminal of the third element is A, a voltage applied to a first terminal thereof is B, a voltage applied to a second terminal thereof is C, voltages are applied to the third element so that a state of A>B and A>C and a state of A<B and A<C, or a state of A>B and A<C and a state of A<B and A>C, or a state of A<B and A>C and a state of A>B and A<C are switched alternately.

In order to solve the problems, according to another aspect of the present invention, there is provided a display apparatus which includes a display panel which includes a plurality of video signal lines, a plurality of scanning signal lines intersecting the video signal lines, and a thin-film transistor which is formed near each intersection of the scanning signal lines and the video signal lines, in which a pixel region is defined in a region surrounded by a pair of adjacent scanning signal lines and a pair of adjacent video signal lines; and a scanning signal line driver circuit which is formed on the same board as the display panel so as to sequentially apply a select signal to the scanning signal lines, wherein the scanning signal line driver circuit is connected to a plurality of shift registers that outputs an output signal, which is obtained by shifting a start pulse based on first and second clock signals, as a start pulse of a next stage, each of the shift registers including, a first element controlled by a first potential node to supply a first driving voltage to an output terminal, a second element controlled by a second potential node to supply a second driving voltage lower than the first driving voltage to the output terminal, and a third element for controlling the first potential node and the second potential node so as to have opposite potential levels, wherein one of first and second terminals of the third element is connected to the second potential node, and the other terminal is connected to an input terminal of the second clock signal, and wherein the second clock signal is input to the other terminal.

In order to solve the problems, according to a further aspect of the present invention, there is provided a display apparatus which includes a display panel which includes a plurality of video signal lines, a plurality of scanning signal lines intersecting the video signal lines, and a thin-film transistor which is formed near each intersection of the scanning signal lines and the video signal lines, in which a pixel region is defined in a region surrounded by a pair of adjacent scanning signal lines and a pair of adjacent video signal lines; and a scanning signal line driver circuit which is formed on the same board as the display panel so as to sequentially apply a select signal to the scanning signal lines, wherein the scanning signal line driver circuit is connected to a plurality of shift registers that outputs an output signal, which is obtained by shifting a start pulse based on first and second clock signals, as a start pulse of a next stage, each of the shift registers including, a transistor element (T5) controlled by a first potential node to supply a first driving voltage to an output terminal, a transistor element (T6) controlled by a second potential node to supply a second driving voltage lower than the first driving voltage to the output terminal, a transistor element (T4) for controlling the first potential node and the second potential node so as to have opposite potential levels, a transistor element (T3) for supplying a fixed high potential to the second potential node in response to an input of the first clock signal, a transistor element (T1) for supplying a fixed high potential to the first potential node in response to an input of the start pulse, a transistor element (T8) for supplying a fixed low potential to the first potential node in response to a shift output of a next stage, a transistor element (T2) controlled by the second potential node to supply a fixed low potential to the first potential node, and a retention capacitor retaining the potential of the second potential node.

According to the aspects of the present invention, it is possible to reduce the shift amount of the threshold voltage of the transistor that constitutes the scanning signal line driver circuit and obtain a proper scanning signal. Therefore, the display apparatus is able to perform a proper image display operation.

Additional features and advantages of the present invention will be apparent from the entire description in the specification.

DETAILED DESCRIPTION OF THE INVENTION

Figure 1:
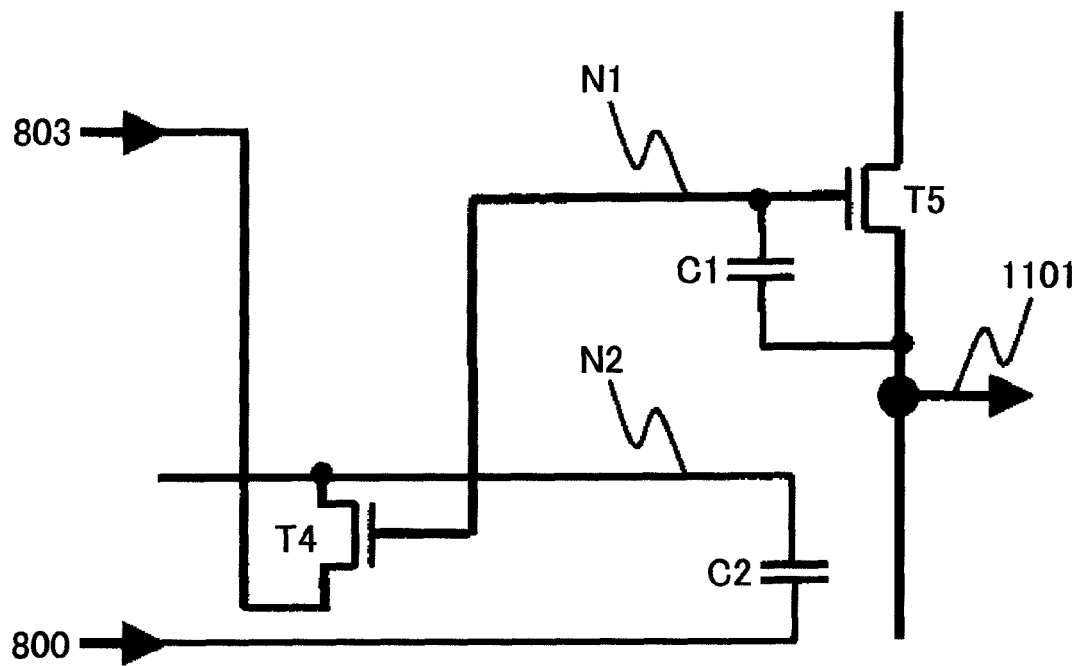
FIG. 1 is a diagram illustrating a schematic configuration of a main part of a shift register circuit in a display apparatus according to a first embodiment of the present invention.

Hereinafter, embodiments of the present invention will be described with reference to the drawings. In the following description, the same or equivalent elements will be denoted by the same reference numerals, and redundant description thereof will be omitted.

First Embodiment

Overall Configuration

Figure 11:
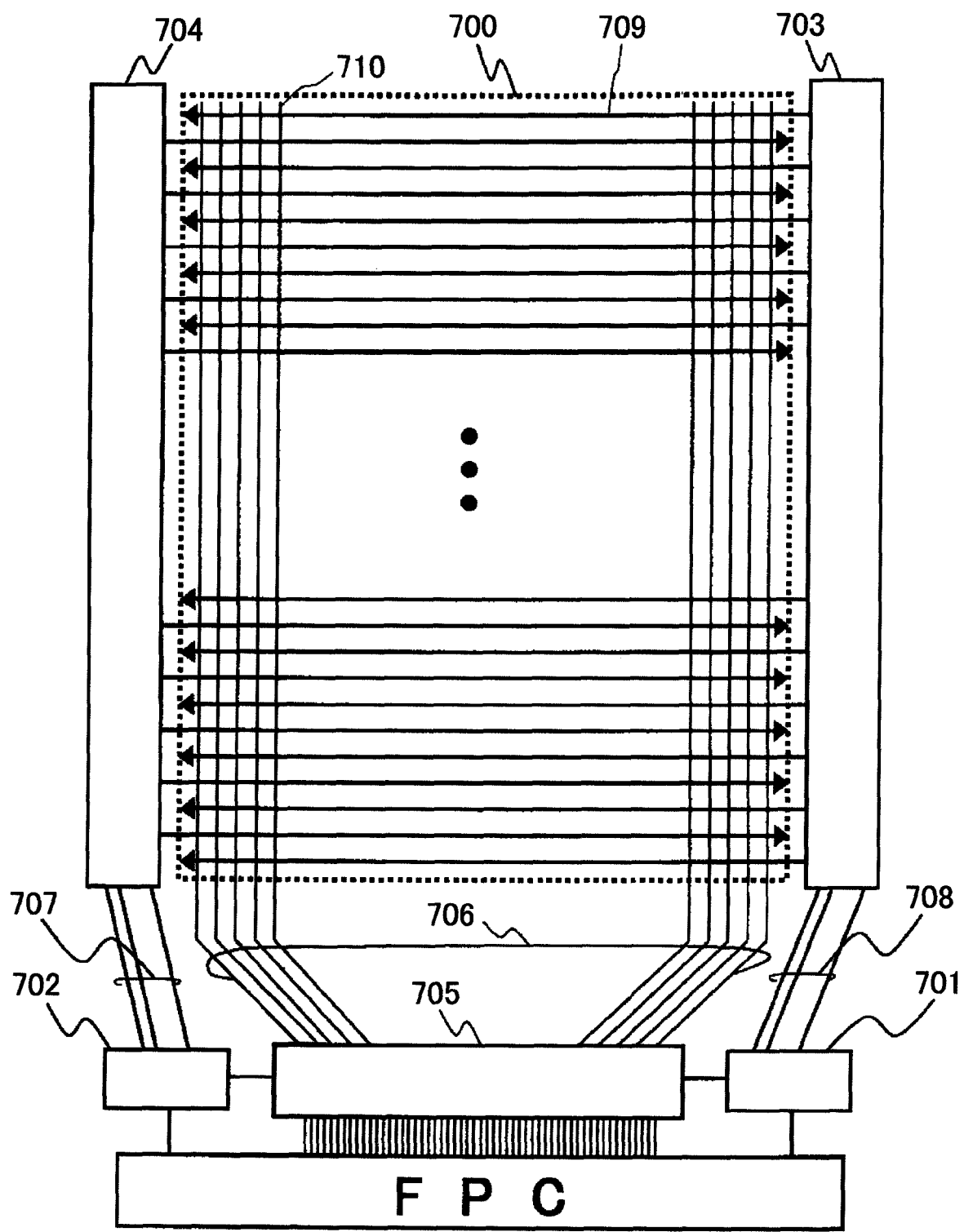
FIG. 11 is a diagram illustrating an internal configuration of the display apparatus according to the first embodiment of the present invention.

FIG. 11 is a diagram illustrating an internal configuration of a display apparatus according to the first embodiment of the present invention. In the figure, reference numeral 700 designates a display region, 701 and 702 each designate a gate circuit control signal generation block, 703 and 704 each designate a gate circuit (scanning signal line driver circuit) having a shift register circuit corresponding to each line, 705 designates a data driver (video signal line driver circuit) transferring a drain signal, a source signal, and a common signal to each pixel, and 706 designates all data wirings of the drain, source, and common signals which are output from the data driver 705. In the figure, solid arrows represent the flows of gate output signals (scanning signals). In the following description, a display apparatus using a liquid-crystal display will be described as an example of a display apparatus. However, the present invention is not limited to this, and for example, the present invention can be applied to a display apparatus in which a well-known organic EL or the like is used as a display device. Moreover, in the following description, a transistor element using an a-Si TFT (amorphous silicon TFT) will be described as an example of a transistor element. However, the present invention can be similarly applied to other TFTs as long as they solve similar problems.

As is clear from FIG. 11, a liquid-crystal display panel of the display apparatus according to the first embodiment includes the gate circuits 703 and 704 which are provided on either side of the liquid-crystal display panel. The gate circuit 703 has shift register circuits (details of which will be described later) that output gate output signals of odd-number stages, and the gate circuit 704 has shift register circuits that output gate output signals of even-number stages. In addition, as the gate circuit control signal generation blocks that output the gate control signals to the gate circuits 703 and 704, the liquid-crystal display panel includes the gate circuit control signal generation block 701 that outputs the gate control signals to the gate circuit 703 and the gate circuit control signal generation block 702 that outputs the gate control signals to the gate circuit 704.

The outputs from the gate circuit control signal generation block 701 are input to the gate circuit 703 through wirings 708. Similarly, the outputs from the gate circuit control signal generation block 702 are input to the gate circuit 704 through wirings 707. That is, the wirings 707 and 708 designate all gate control wirings through which the outputs from the gate circuit control signal generation blocks 701 and 702 are output to the gate circuits 703 and 704.

Moreover, in the liquid-crystal display panel according to the first embodiment, gate lines (scanning signal lines) 709 that extend in the horizontal direction in FIG. 11 in parallel in the vertical direction and drain lines (video signal lines) 710 that extend in the vertical direction in parallel in the horizontal direction are formed in the display region 700. Furthermore, rectangular regions surrounded by adjacent two gate lines 709 and adjacent two drain lines 710 form pixel regions, whereby pixels are arranged in a matrix form in the display region. In addition, a color filter (not shown) of any of the colors red (R), green (G), and blue (B) is formed in each pixel region. In particular, in the display apparatus according to the first embodiment, a unit pixel for color display is formed by the three pixels of R, G, and B which are arranged to be adjacent in the extending direction of the gate lines 709. However, the configuration of the unit pixel for color display is not limited to this.

Each pixel includes a thin-film transistor (which is not shown, and in the present embodiment, is configured by an a-Si TFT) which is turned on by a scanning signal from the gate line 709, a pixel electrode (not shown) to which a video signal from the drain line 710 is supplied via the thin-film transistor in the on state, and a common electrode which is connected to a common line (not shown), and to which a reference signal having a reference potential relative to the video signal potential is supplied.

Moreover, a display signal from an external apparatus (not shown) is input to the gate circuit control signal generation blocks 701 and 702 and the data driver 705 through an FPC. In the first embodiment, although the data driver 705 is formed by a semiconductor device, which is configured by a semiconductor chip, and is mounted on the liquid-crystal display panel, the data driver 705 may be mounted on a flexible printed board (FPC).

As a method of driving the gate output signals in the liquid-crystal display panel according to the first embodiment, an overlap-scan driving method is used. That is, the gate output signals are successively output to each line for two line periods. However, the gate output signal driving method is not limited to such an overlap-scan driving method. For example, an overlap-scan driving method wherein the gate output signals are successively output for n-line periods (n: integer of 3 or more), and a driving method other than the overlap-scan method wherein the gate output signals are output for only one line period may be used. In addition, in the liquid-crystal display panel according to the first embodiment, the scanning of the gate output signals is sequentially performed from an opposite side of the FPC (flexible printed board), namely a side (the upper side in FIG. 11) distant from the FPC.

[Gate Circuit Configuration]

Figure 12:
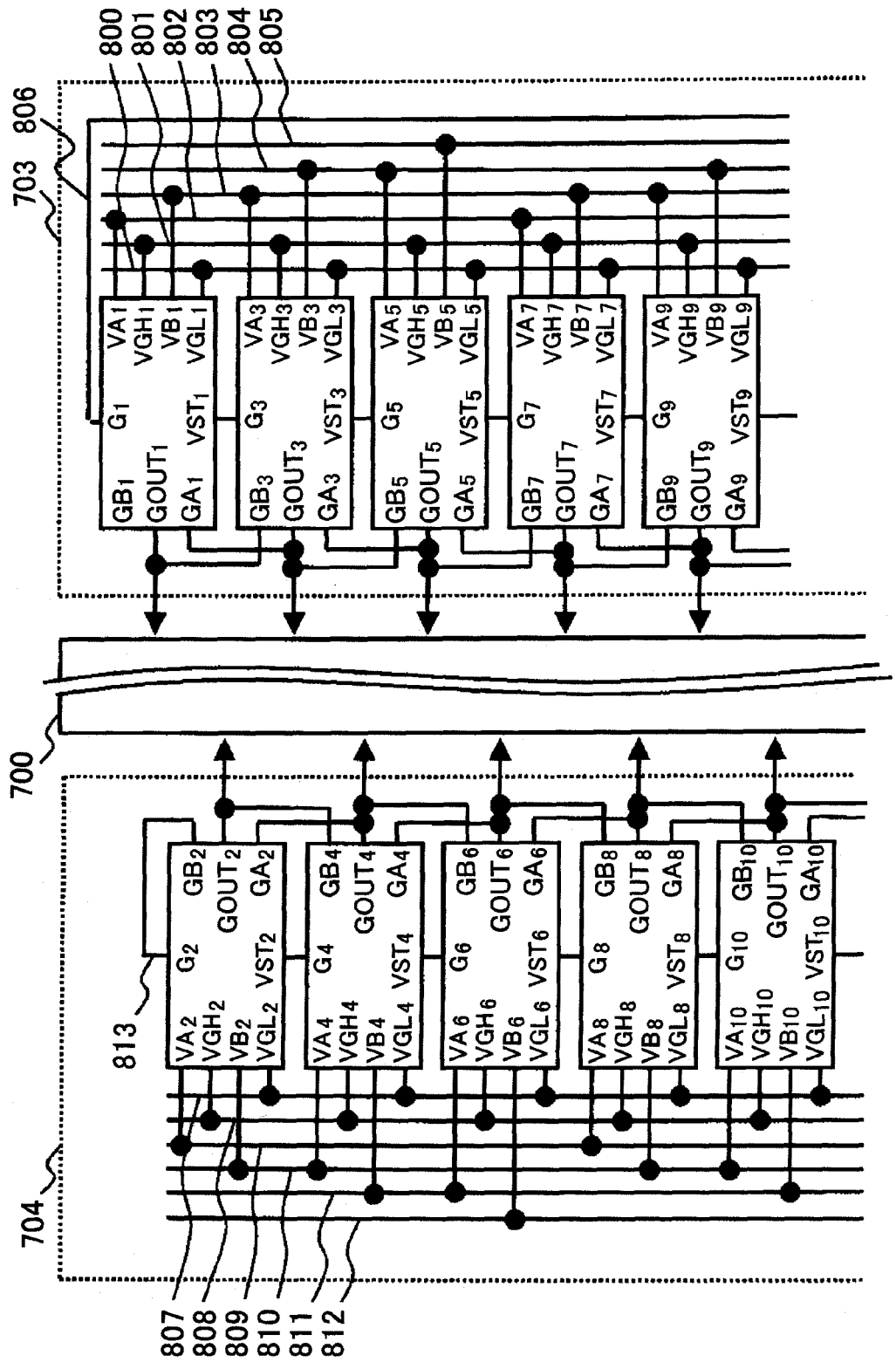
FIG. 12 is a diagram illustrating a schematic configuration of a gate circuit in the display apparatus according to the first embodiment of the present invention.

FIG. 12 is a diagram illustrating a schematic configuration of the gate circuit in the display apparatus according to the first embodiment of the present invention. Hereinafter, a method of controlling the gate circuit that is formed using the shift register circuit according to the first embodiment will be described with reference to FIG. 12. Referring to FIG. 12, the inner configuration of the gate circuits 703 and 704 shown in FIG. 11 is illustrated, and the shift register circuits of the first to tenth stages are illustrated. In addition, a shift register circuit corresponding to the n-th line are denoted by $G_n$. For example, $G_1$ represents a shift register circuit of the first stage, and $G_3$ represents a shift register circuit of the third stage.

A fixed high voltage VGH and a fixed low voltage VGL are input to the respective shift register circuits $G_n$ constituting the gate circuits 703 and 704 through a wiring 801 or 808 and a wiring 800 or 807, respectively.

Moreover, clock potential signals which change periodically with respect to the time axis are input to the respective shift register circuits $G_n$ through wirings 802 to 806 and wirings 809 to 813, respectively. The timings and magnitudes of the clock potential signals will be described in detail later.

As is clear from FIG. 12, five wirings for inputting the clock potential signals are connected to the respective shift register circuits $G_n$. Among the five wirings, regarding the four wirings 802 to 805 and the four wirings 809 to 812, the number of wirings may be changed. The present embodiment describes a case of an 8-phase gate clock wherein the wirings through which the clock potential signals (gate clocks) are input are controlled using eight wirings in total. However, the number of wirings through which the clock potential signals are input may be increased to 16, 32, and the like, as long as the frame size of the panel can accommodate the wirings. Generally speaking, the clock potential signals can be controlled by n phases (where n is a natural number).

Next, signals which are input and output to and from terminals in the shift register circuit according to the first embodiment will be described by way of an example of the shift register circuit $G_3$ that drives the gate line on the third line. First, a gate output signal (gate signal) from the shift register circuit $G_1$ of the previous stage is input to a terminal $GB_3$ which is an input terminal of the shift register circuit $G_3$. A gate output signal on the third line is output from a terminal $GOUT_3$ which is an output terminal. A gate output signal from the shift register circuit $G_5$ of the next stage is input to a terminal $GA_3$ which is an input terminal. Terminals $VGL_3$ and $VGH_3$ which are input terminals are connected to the wirings 800 and 801, respectively, and the fixed high voltage VGH and the fixed low voltage VGL which have predetermined values with respect to the time axis are always input to the terminals $VGH_3$ and $VGL_3$, respectively. Terminals $VA_3$ and $VB_3$ which are input terminals are connected to the wirings 803 and 804, respectively, and clock potential signals having different phases are input to the terminals $VA_3$ and $VB_3$. A terminal $VST_3$ which is an input terminal is connected to the wiring 806, and a clock potential signal shown in FIG. 13 which will be described later is input to the terminal VST.

Figure 13:
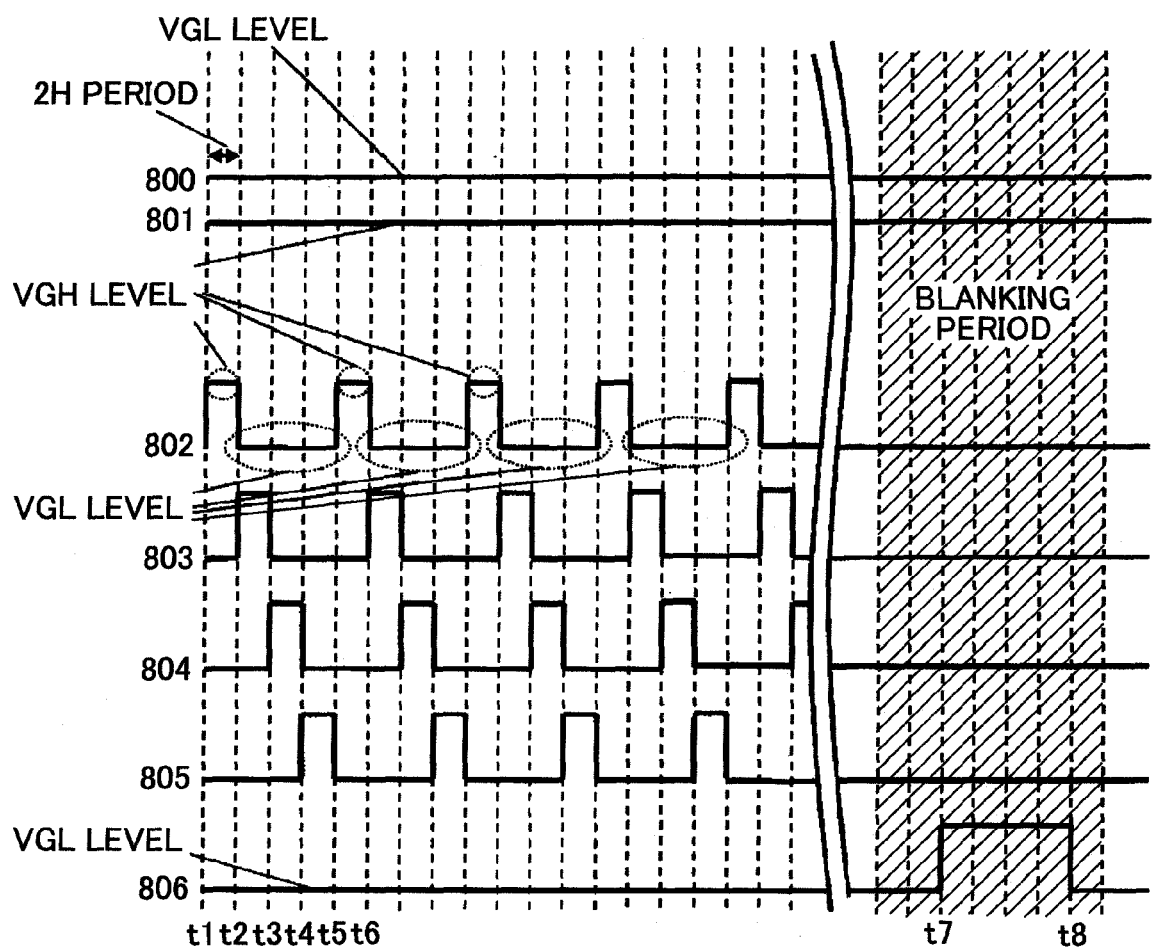
FIG. 13 is a diagram illustrating a gate clock that is input to the gate circuit in the display apparatus according to the first embodiment of the present invention.

FIG. 13 is a diagram illustrating the gate clock that is input to the gate circuit in the display apparatus according to the first embodiment of the present invention. Hereinafter, an operation of the gate circuit that is formed using the shift register circuit according to the first embodiment will be described with reference to FIGS. 12 and 13. Referring to FIG. 13, the voltages applied to the wirings 800 to 806 in the gate circuit 703 are illustrated in the time axis direction.

The VGL and VGH levels which are always constant with respect to the time axis are applied to the wirings 800 and 801, respectively. As for the wirings 802 to 805, a cyclic operation takes place during 8H periods wherein the VGH level is applied for 2H periods and the VGL level is applied for the remaining 6H periods, and a similar operation takes place periodically with respect to the time axis.

Moreover, the VGH level is applied to the wiring 803 with a delay of 2H periods later than the wiring 802. Similarly, the VGH level is applied to the wiring 804 with a delay of 2H periods later than the wiring 803, and the VGH level is applied to the wiring 805 with a delay of 2H periods later than the wiring 804. However, these are the timings concerning the 8-phase gate clock. In the case of a n-phase gate clock, as for the wirings 802 to 805, a cyclic operation takes place during nH periods wherein the VGH level is applied for 2H periods and the VGL level is applied for the remaining (n−2)H periods, and a similar operation takes place periodically with respect to the time axis.

Lastly, the operation regarding the wirings 806 and 813 will be described. As for the wirings 806 and 813, during the blanking period, the VGH level is applied for L (>0) periods, and the VGL level is applied for the remaining periods. In the present embodiment and an embodiment described later, the description will be given for L=4.

That is to say, a 4-phase gate clock is input to each of the gate circuits 703 and 704 that use the shift register according to the first embodiment. For example, the gate circuit 703 receives, through the wiring 802, a gate clock having a cycle period of 8H during which the VGH level is output for 2H periods (periods t1 to t2) and the VGL level is output for 6H periods (periods t2 to t5). Moreover, the gate circuit 703 receives, through the wiring 803, a gate clock having a cycle period of 8H during which the VGL level is output for 2H periods (periods t1 to t2), the VGH level is output for 2H periods (periods t2 to t3), and the VGL level is output for 4H periods (periods t3 to t5). Furthermore, the gate circuit 703 receives, through the wiring 804, a gate clock having a cycle period of 8H during which the VGL level is output for 4H periods (periods t1 to t3), the VGH level is output for 2H periods (periods t3 to t4), and the VGL level is output for 2H periods (periods t4 to t5). In addition, the gate circuit 703 receives, through the wiring 805, a gate clock having a cycle period of 8H during which the VGL level is output for 6H periods (periods t1 to t4) and the VGH level is output for 2H periods (periods t4 to t5).

Furthermore, the gate circuit 703 receives, through the wiring 806, a signal which becomes a low level for periods t1 to t7, and a high level for periods t7 to t8 and a low level for the periods subsequent to t8: that is, the signal becomes the high level for only a predetermined period in the blanking period.

Figure 14:
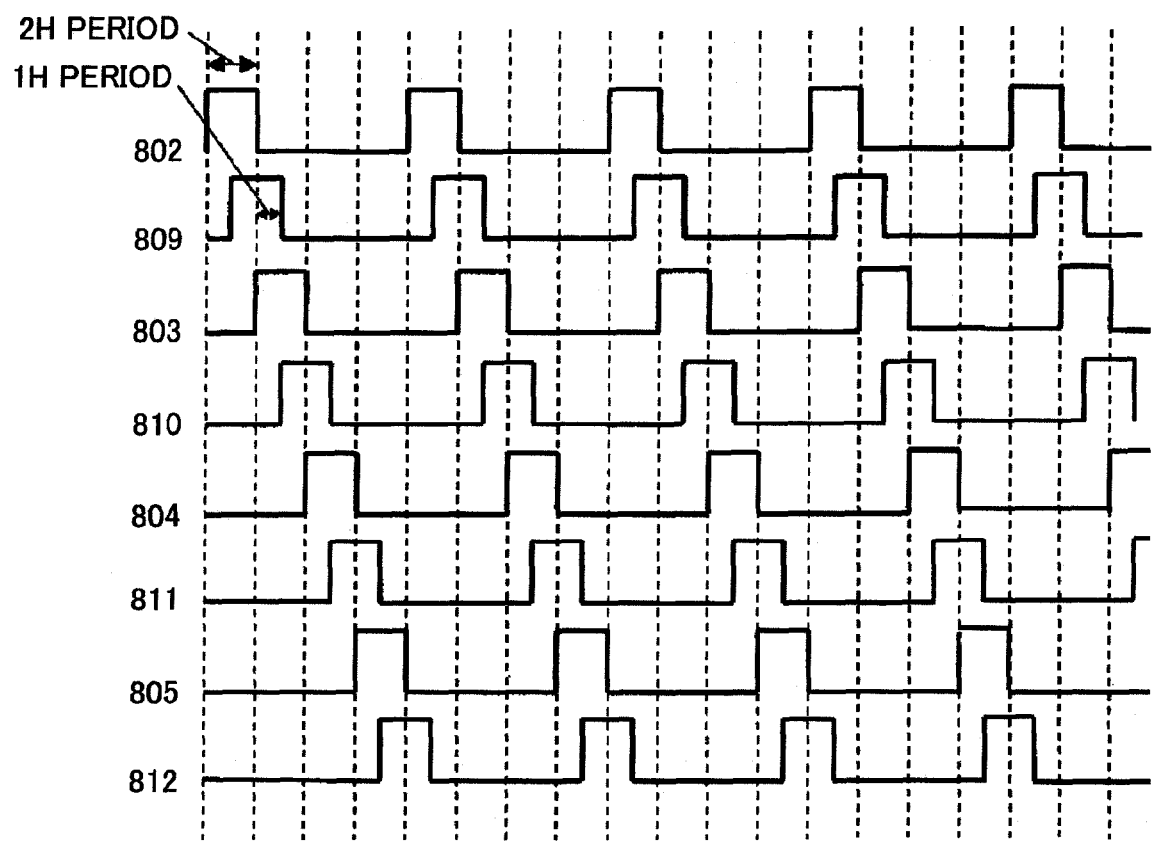
FIG. 14 is a diagram illustrating gate clocks that are respectively input to two gate circuits in the display apparatus according to the first embodiment of the present invention.

FIG. 14 is a diagram illustrating the gate clocks that are respectively input to the two gate circuits in the display apparatus according to the first embodiment of the present invention. That is, the gate clocks which are input to the gate circuits 703 and 704 disposed on the left and right in FIG. 12, respectively, are illustrated.

As shown in FIG. 14, the wiring 809 performs the same operation as the wiring 802 with a delay of 1H period. That is, the potential of the wiring 809 starts rising from the VGL level to the VGH level with a delay of 1H period later than the wiring 802. Similarly, the wiring 810 performs the same operation as the wiring 803 with a delay of 1H period, the wiring 811 performs the same operation as the wiring 804 with a delay of 1H period, and the wiring 812 performs the same operation as the wiring 805 with a delay of 1H period. In this manner, the gate circuits 703 and 704 according to the first embodiment are configured to receive a gate clock having a cycle period of 8H with an offset of 1H period.

Figure 15:
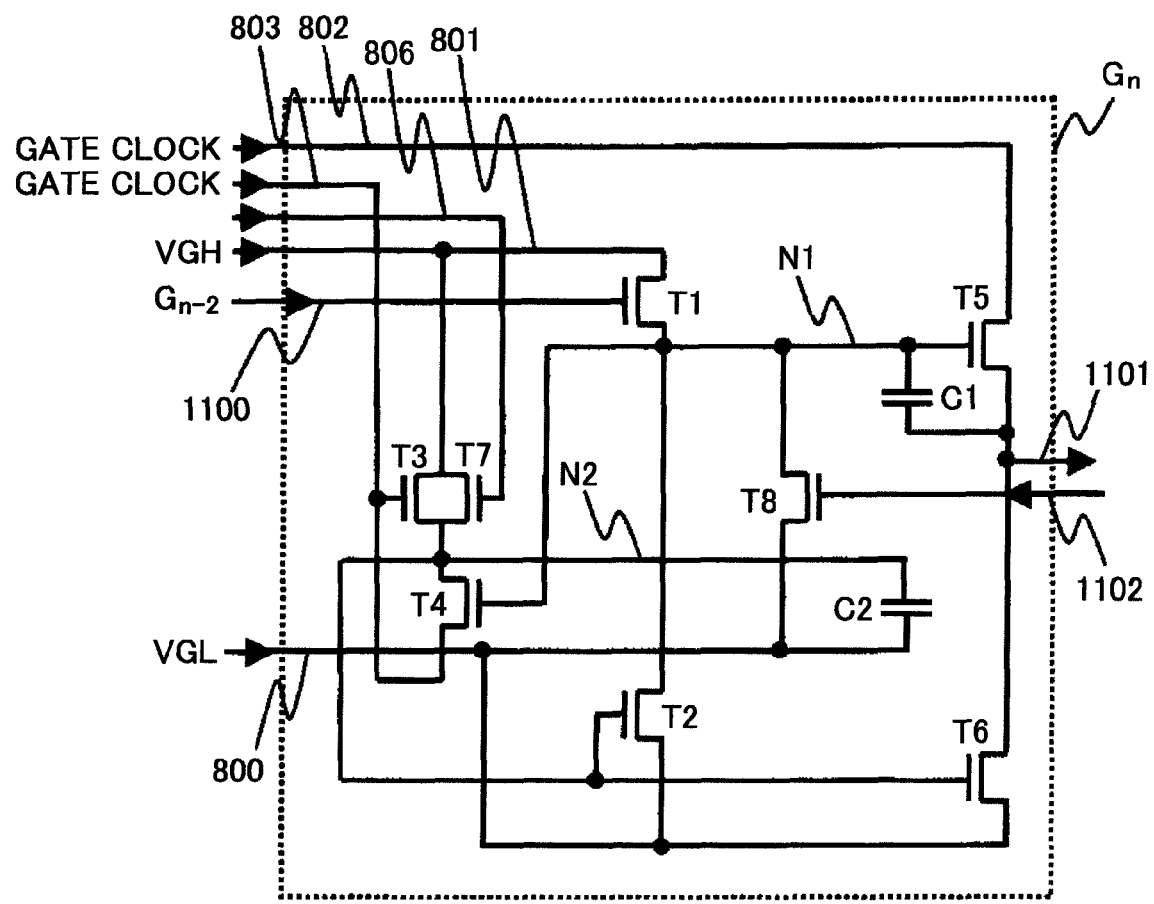
FIG. 15 is a diagram illustrating a detailed configuration of the shift register circuit in the display apparatus according to the first embodiment of the present invention.
Figure 16:
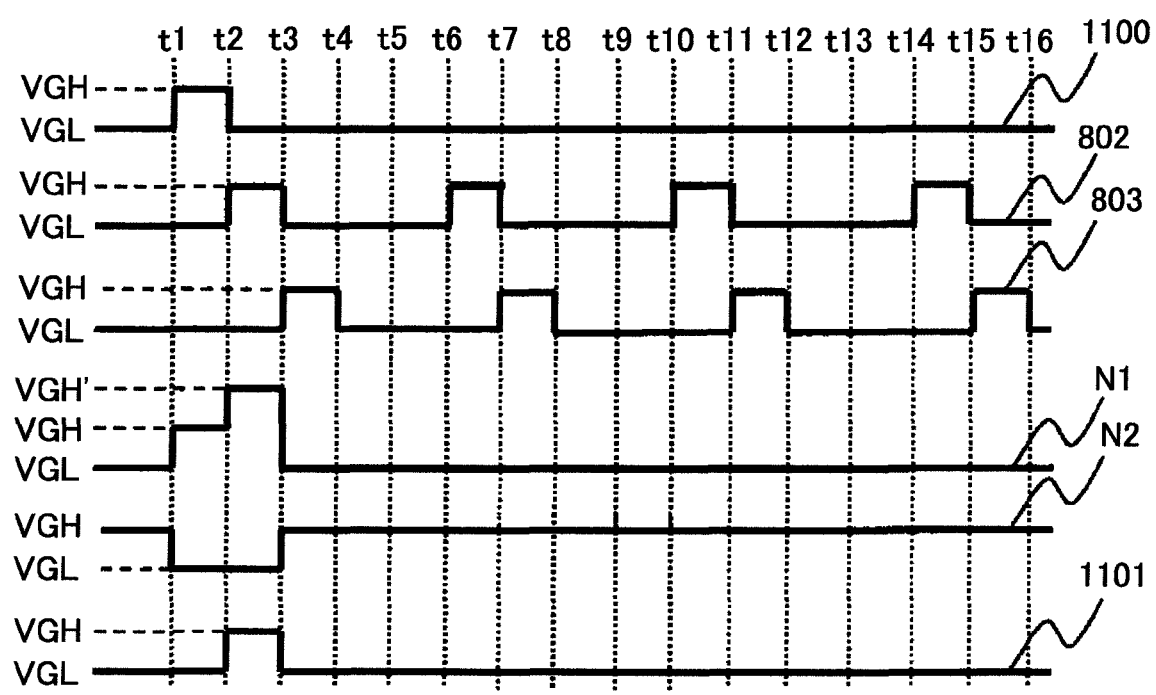
FIG. 16 is a diagram illustrating a detailed operation of the shift register circuit in the display apparatus according to the first embodiment of the present invention.

FIGS. 15 and 16 are diagrams illustrating the details of the shift register circuit in the display apparatus according to the first embodiment of the present invention. Hereinafter, a correcting operation in the shift register circuit according to the first embodiment will be described with reference to FIGS. 15 and 16. FIG. 15 is a diagram illustrating a detailed configuration of the shift register circuit in the display apparatus according to the first embodiment of the present invention, and FIG. 16 is a diagram illustrating a detailed operation of the shift register circuit in the display apparatus according to the first embodiment of the present invention. The shift register circuit shown in FIG. 15 is a shift register circuit $G_n$ of the n-th stage, and FIG. 16 illustrates the timings of the main operation in the circuit shown in FIG. 15. It should be noted that the respective shift register circuits have the same basic configuration except that the input signals thereof are connected differently. In FIG. 15, reference numerals 1100 to 1102 each designate a potential signal, T1 to T8 each designate a transistor, and N1 and N2 each designate a potential node.

As is clear from FIG. 15, the shift register circuit according to the first embodiment is formed by eight transistors T1 to T8 and two capacitor elements C1 and C2. The transistor T1 has a configuration in which a gate terminal is connected to a wiring 1100 to which a gate output signal of a previous stage is applied, a source terminal is connected to the wiring 801 to which a fixed high voltage VGH is applied, a drain terminal is connected to a first potential node N1. The transistor T2 has a configuration in which a gate terminal is connected to a second potential node N2, a drain terminal is connected to the wiring 800 to which a fixed low voltage VGL is applied, and a source terminal is connected to the first potential node N1. The transistor T3 has a configuration in which a gate terminal is connected to the wiring 803 to which a second clock signal is applied, a source terminal is connected to the second potential node N2, and a drain terminal is connected to the wiring 801 to which the fixed high voltage VGH is applied. The transistor T4 has a configuration in which a gate terminal is connected to the first potential node N1, a source terminal is connected to the wiring 800 to which the fixed low voltage VGL is applied, and a drain terminal is connected to the wiring 803 to which the second clock signal is applied. The transistor T5 has a configuration in which a gate terminal is connected to the first potential node N1, a drain terminal is connected to an output terminal 1101 of a gate output signal of the present stage, and a source terminal is connected to the wiring 802 to which a first clock signal is applied. The transistor T6 has a configuration in which a gate terminal is connected to the second potential node N2, a source terminal is connected to the wiring 800 to which the fixed low voltage VGL is applied, and a drain terminal is connected to the output terminal 1101 of the gate output signal of the present stage. The transistor T7 has a configuration in which a gate terminal is connected to the wiring 806 to which a start pulse signal is applied, a source terminal is connected to the second potential node N2, and a drain terminal is connected to the wiring 801 to which a fixed high voltage VGH is applied. The transistor T8 has a configuration in which a gate terminal is connected to a wiring 1102 to which a gate output signal of a next stage is applied, a source terminal is connected to the wiring 800 to which the fixed low voltage VGL is applied, and a drain terminal is connected to the first potential node N1.

Moreover, the capacitor element C1 is connected between the first potential node N1 and the output terminal 1101 of the gate output signal of the present stage and configured to function as a charging capacitor. The capacitor element C2 is connected between the second potential node N2 and the fixed low potential VGL and configured to function as a retention capacitor.

Next, the internal operation of the shift register circuit at the time of outputting the gate output signal will be described with reference to FIG. 16. First, $G_{n-2}$ (which corresponds to 1100 in FIGS. 15 and 16), which is the gate output signal output from the (n−2)th stage being two stages ahead of the present stage, is input to the gate terminal of the transistor T1. At the same time, the VGH voltage is input from the wiring 801 being connected to the drain terminal of the transistor T1 (periods t1 to t2). In response to the supply of the VGH voltage from the drain terminal of the transistor T1, during the periods t1 to t2, the potential of the first potential node N1 rises from the VGL level to the VGH level, and the VGH voltage is applied to the gate terminal of the transistor T5. When the first potential node N1 rises to the VGH level, the VGH voltage is applied to the gate terminal of the transistor T4, the VGL voltage is applied to the second potential node N2 from the wiring 803 being connected to the drain terminal of the transistor T4. Thus, the potential of the second potential node N2 becomes the VGL level at time t1.

At time t2 after the 2H periods, the potential of the wiring 802 to which the gate clock is input starts rising from the VGL level to the VGH level, and the VGH level is applied to the drain terminal of the transistor T5. At the same time, the potential of the first potential node N1 rises further from the VGH level to a higher level VGH' due to an effect of the capacitor C1 being connected to the source terminal of the transistor T5. The value of the VGH' is ideally 30V or higher, and may have another value if it is higher than at least the value of the VGH. By this operation, the gate output signal 1101 is output during the 2H periods of t2 to t3.

At time t3 after the 2H periods, in response to the supply of the gate clock, the potential of the wiring 803 starts rising from the VGL level to the VGH level. As a result, a VGH voltage is applied to the gate terminal of the transistor T3 at time t3, and the VGH voltage is applied to the second potential node N2 from the wiring 801 being connected to the drain terminal of the transistor T3. Thus, the potential of the second potential node N2 being connected to the source terminal of the transistor T3 starts rising from the VGL level to the VGH level. In that time, the capacitor C2 is charged, and the potential of the second potential node N2 maintains the VGH level.

In addition, at the time (time t3) when the potential of the wiring 803 starts rising from the VGL level to the VGH level, an output signal from $G_{n+2}$ (which corresponds to 1102 in FIG. 15) is input to the gate terminal of the transistor T8. However, it should be noted that an output signal from $G_{n+m}$ (m: integer of 3 or more) may be input to the gate terminal of the transistor T8. Accordingly, the potential of the first potential node N1 starts falling from the VGH' level to the VGL level. Moreover, when the potential of the second potential node N2 becomes the VGH level, the gate terminals of the transistors T2 and T6 start rising from the VGL level to the VGH level. At that time, the transistor T2 operates in a direction where the potential of the first potential node N1 is pulled down from the VGH level to the VGL level, and the transistor T6 operates in a direction where the gate output signal 1101 is pulled down from the VGH level. Therefore, the first potential node N1 falls to the VGL level, and the gate output signal 1101 maintains the VGL level.

Since the potential of the wiring 806 is in the VGH level for 4H periods in the blanking period, by pulling up the potential of the second potential node N2 to the VGH level using the transistor T7, the potential of the second potential node N2 is stabilized. In the respective shift register circuits that constitute the gate circuit according to the present embodiment, since the operation described above is successively performed during one frame period, a stable gate output signal can be output.

That is, in the shift register according to the first embodiment, the drain terminal of the transistor T4 is connected to the wiring 803. With this configuration, during the periods (periods excluding the periods t1 to t3) where the potential of the source terminal of the transistor T4 is equal to or higher than the VGH level, the drain terminal of the transistor T4 can have the VGH level during the periods t3 to t4 which correspond to the 2H periods of the 8H periods. As a result, compared to the case where the drain terminal of the transistor T4 is connected to the wiring 800 that outputs the constant VGL level with respect to the time axis, it is possible to accelerate a shift of the threshold voltage of the transistor T4 in the backward direction, namely in a direction of decreasing the threshold voltage. Moreover, it is possible to reduce a shift of the threshold voltage of the transistor T4 in a direction of increasing the threshold voltage. Therefore, the potential of the second potential node N2 can be stabilized, and the shift register circuit of each stage can output properly a stable gate output signal. That is to say, since a shift amount of the threshold voltage of each of the transistors that constitute the gate circuit can be reduced, it is possible to obtain a proper scanning signal and realize a display apparatus having a high display quality.

[Threshold Voltage Shift]

Figure 3A:
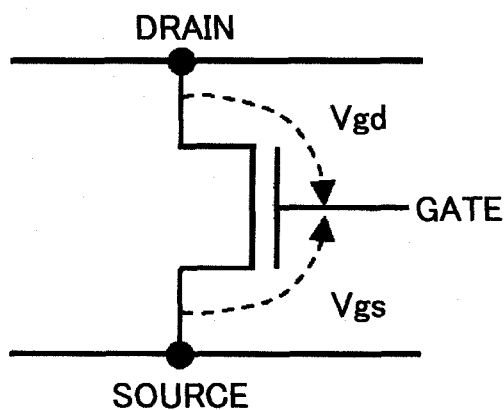
FIGS. 3A and 3B are diagrams illustrating the principle of a threshold voltage shift, showing a case where the threshold voltage of a transistor element is shifted toward a higher side.
Figure 3B:
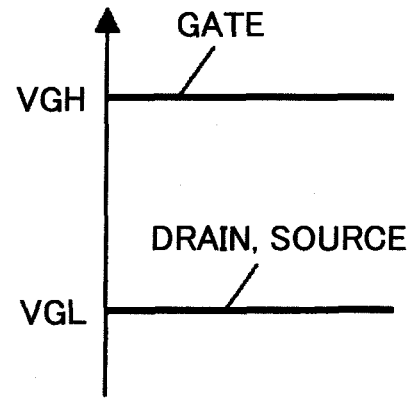
Figure 4A:
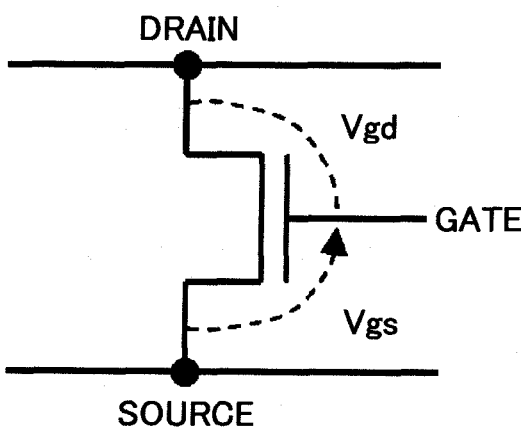
FIGS. 4A and 4B are other diagrams illustrating the principle of a threshold voltage shift, showing a case where the threshold voltage of a transistor element is shifted toward a higher side.
Figure 4B:
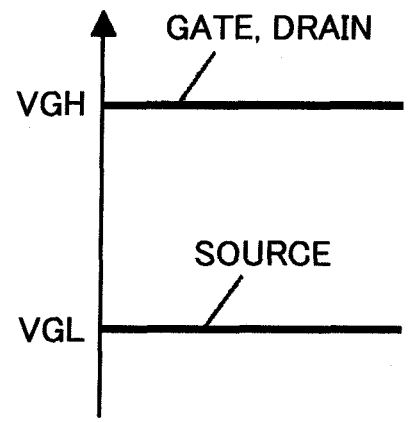
Figure 5:
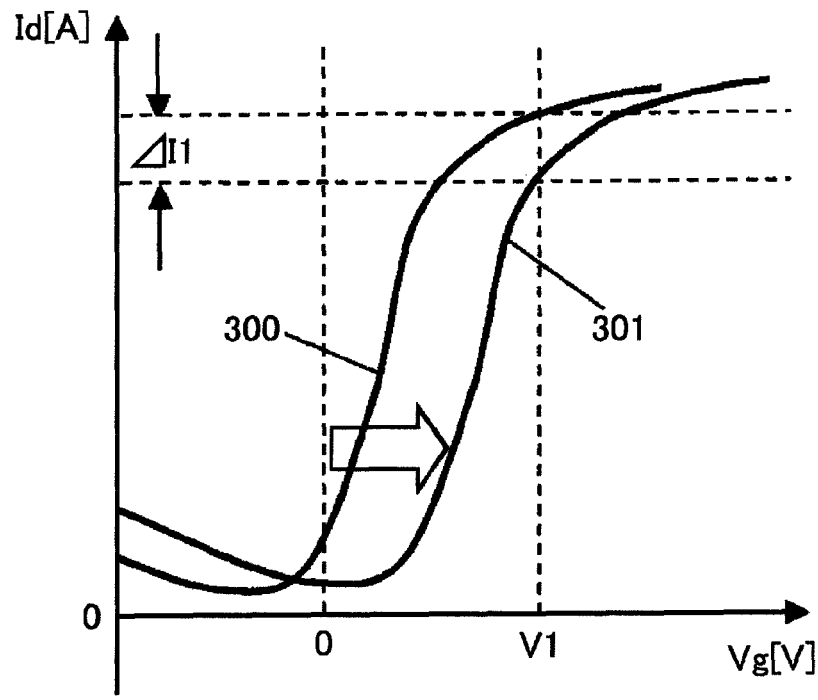
FIG. 5 is a diagram illustrating an effect on the TFT characteristics, of the threshold voltage shift shown in FIGS. 3A, 3B, 4A and 4B.
Figure 6:
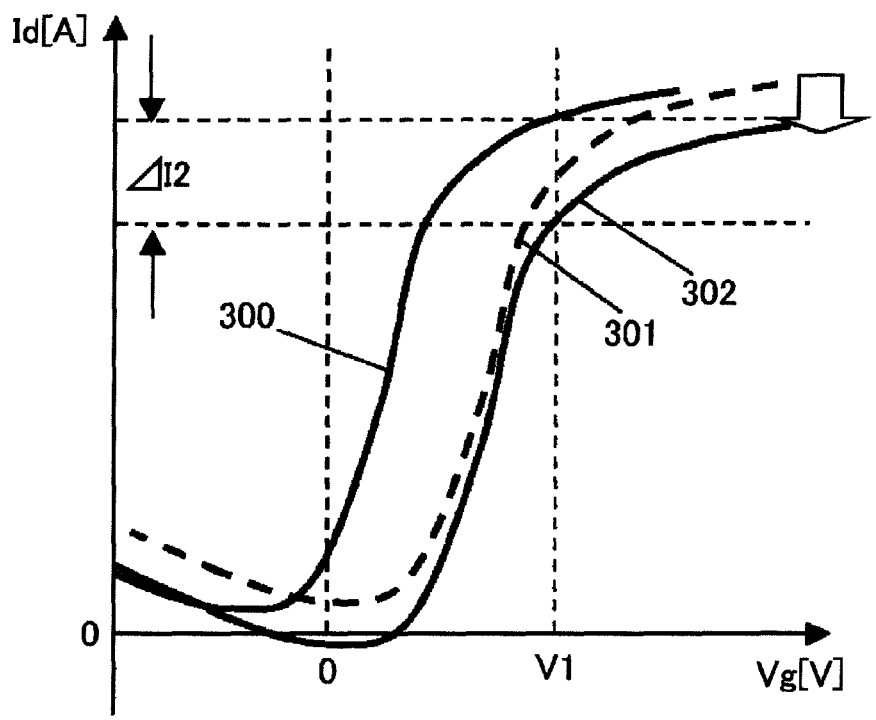
FIG. 6 is another diagram illustrating an effect on the TFT characteristics, of the threshold voltage shift shown in FIGS. 3A, 3B, 4A and 4B.

FIGS. 3A, 3B, 4A and 4B are diagrams illustrating the principle of a threshold voltage shift, showing a case where the threshold voltage of a transistor element is shifted toward a higher side, and FIGS. 5 and 6 are diagrams illustrating an effect on the TFT characteristics, of the threshold voltage shift shown in FIGS. 3A, 3B, 4A and 4B. Specifically, FIGS. 3A and 3B illustrate a case where a voltage applied to the gate terminal is higher than a voltage applied to the drain and source terminals, and FIGS. 4A and 4B illustrate a case where a voltage applied to the gate and drain terminals is higher than a voltage applied to the source terminal (where a relation that the gate potential is the same as the drain potential is satisfied). In addition, FIG. 5 illustrates an effect of the threshold voltage shift on the TFT characteristics under a room temperature condition, and FIG. 6 illustrates the effect on the TFT characteristics when a transistor element exhibiting the characteristics shown in FIG. 5 was placed in a low-temperature environment. It should be noted that in FIGS. 4A and 4B, the potentials of the drain and source may be substituted for each other. Moreover, in FIGS. 3A to 6, reference numeral Vgd represents a voltage applied between the gate and drain, Vgs represents a voltage applied between the gate and source, Vg represents the value of a voltage applied to the gate, Id represents a current flowing between the drain and source when the voltage Vg is applied to the gate.

As shown in FIGS. 3A and 3B, in an a-Si TFT which is a transistor element, when a voltage higher than that applied to the drain and source terminals is continuously applied to the gate terminal (this state is called a DC stress), the threshold voltage of the TFT is shifted to a higher side. It is known that this problem is not limited to only the a-Si TFT, but a similar problem occurs in organic TFTs and the like. The VGH shown in FIGS. 3A, 3B, 4A and 4B is a potential (voltage) which is ideally set within a range of 10V and higher, and the VGL is a potential (voltage) which is ideally set within a range of −20V to 0V. However, the VGL may be set to any value as long as it is in a range of potentials lower than the VGH level. Similarly, the VGH may be set to any value as long as it is in a range of potentials higher than the VGL level. In addition, the same statement can be applied to the VGH and VGL mentioned in conjunction with description of the shift register circuit according to the first embodiment.

As shown in FIGS. 3A and 3B, when the potential of the gate terminal is higher than the potentials of the drain and source terminals, namely Vgd>0 and Vgs>0, the threshold voltage of the TFT is shifted toward a higher side. In this case, as shown in FIGS. 4A and 4B, when the potentials of the gate and drain terminals is higher than the potential of the source terminal, namely Vgs>0, the threshold voltage of the TFT is also shifted toward a higher side. In this case, as shown in FIGS. 4A and 4B, when the potentials of the gate and drain terminals are higher than the source terminal, since the voltage Vgd is 0, an acceleration rate of the threshold shift is decelerated. Therefore, the shift amount of the threshold voltage of the TFT decreases to be smaller than that in the case of FIGS. 3A and 3B where Vgd>0 and Vgs>0.

The driving capability of the TFT when the threshold voltage of the TFT is shifted toward the higher side corresponds to the driving capability as shown by a Vg-Id curve 301 in FIG. 5, which shows the Vg-Id curve of the a-Si TFT, in which the horizontal axis represents Vg, and the vertical axis represents Id. As shown in FIG. 5, a Vg-Id curve 300 is shifted to the Vg-Id curve 301 along the horizontal axis Vg in the direction denoted by a solid arrow. As a result, even when the same voltage (for example, a voltage V1 is applied to the gate terminal, Vg=V1) was applied to the gate terminal, as shown in FIG. 5, the current Id flowing between the drain and source decreases by an amount of ΔI1, and the driving capability is decreased by an amount of ΔI1. That is, the driving capability of the TFT in which the threshold voltage was shifted toward the higher side, and which exhibits characteristics such as the Vg-Id curve 301 will be decreased to be lower than that of the Vg-Id curve 300.

Furthermore, as shown in FIG. 6, because of the TFT characteristics, in a low-temperature environment, it is known that the Vg-Id curve 301 depicted by a dotted line is shifted in a negative direction with respect to the vertical axis as denoted by a solid arrow in the figure. Thus, the Vg-Id curve 301 is shifted to a Vg-Id curve 302. Therefore, the decrement ΔI1 of the driving capability increases to ΔI2, and the driving capability is decreased further. Moreover, an acceleration rate of the threshold voltage shift increases in proportion to the magnitude of Vgs and Vgd.

Figure 7A:
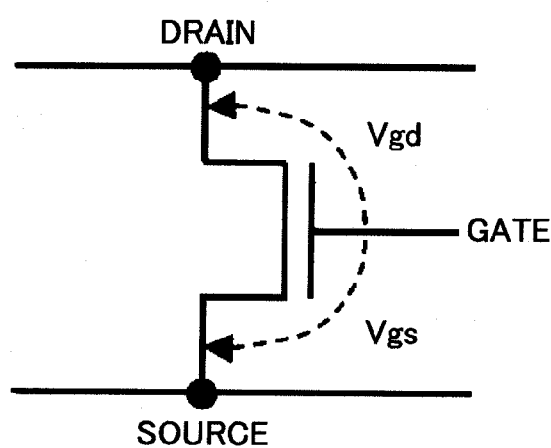
FIGS. 7A and 7B are diagrams illustrating the principle of a threshold voltage shift, showing a case where the threshold voltage of a transistor element is shifted toward a lower side.
Figure 7B:
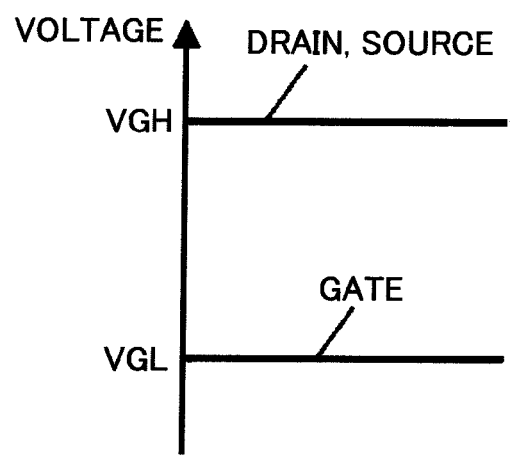
Figure 8A:
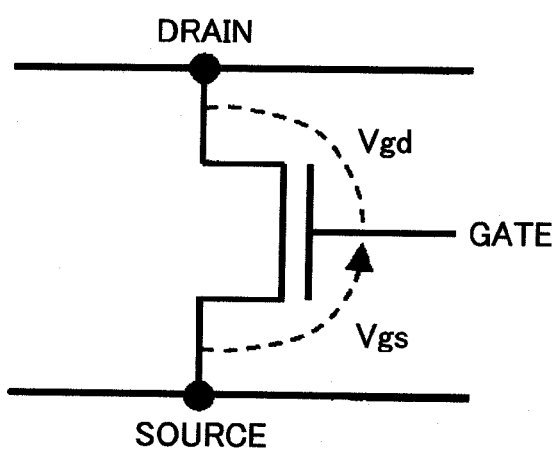
FIGS. 8A and 8B are other diagrams illustrating the principle of a threshold voltage shift, showing a case where the threshold voltage of a transistor element is shifted toward a lower side.
Figure 8B:
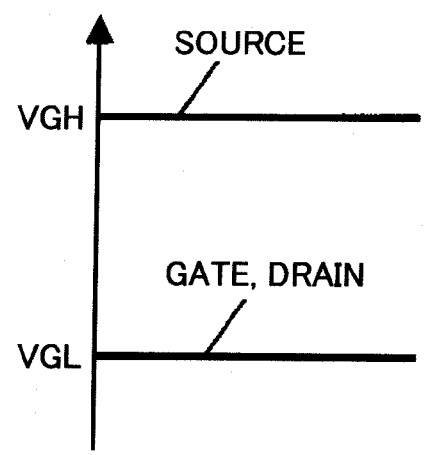
Figure 9:
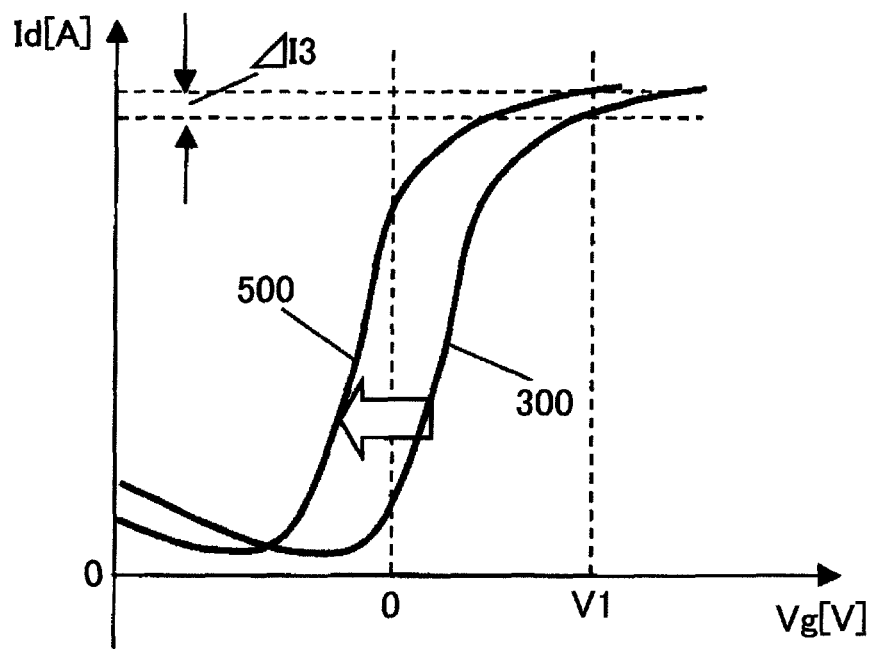
FIG. 9 is a diagram illustrating an effect on the TFT characteristics, of the threshold voltage shift shown in FIGS. 7A, 7B, 8A and 8B.

FIGS. 7A, 7B, 8A and 8B are diagrams illustrating the principle of a threshold voltage shift, showing a case where the threshold voltage of a transistor element is shifted toward a lower side, and FIG. 9 is a diagram illustrating an effect on the TFT characteristics, of the threshold voltage shift shown in FIGS. 7A, 7B, 8A and 8B. Hereinafter, a description will be given of a case where the threshold voltage of the transistor element is shifted to a lower side with reference to FIGS. 7A to 9. Specifically, FIGS. 7A and 7B illustrate a case where a voltage applied to the gate terminal is lower than a voltage applied to the drain and source terminals, and FIGS. 8A and 8B illustrate a case where a voltage applied to the gate and drain terminals is lower than a voltage applied to the source terminal (where a relation that the gate potential is the same as the drain potential is satisfied). In addition, FIG. 9 illustrates an effect of the threshold voltage shift on the TFT characteristics under a room temperature condition. It should be noted that in FIGS. 8A and 8B, the potentials of the drain and source may be substituted with each other.

As shown in FIGS. 7A and 7B, when a voltage lower than that applied to the drain and source terminals is continuously applied to the gate terminal of an a-Si TFT, the threshold voltage of the TFT is shifted to a lower side (this state is also called a DC stress). When the potential of the gate terminal is lower than the potentials of the drain and source terminals, namely Vgd<0 and Vgs<0, the threshold voltage of the TFT is shifted toward a lower side. In this case, as shown in FIGS. 8A and 8B, when the potentials of the gate and drain terminals are lower than the potential of the source terminal, namely Vgs<0, the threshold voltage of the TFT is also shifted toward a lower side. In this case, as shown in FIGS. 8A and 8B, when the potentials of the gate and drain terminals are higher than the source terminal, since the voltage Vgd is 0, an acceleration rate of the threshold shift is decelerated. Therefore, the shift amount of the threshold voltage of the TFT decreases to be smaller than that in the case of FIGS. 7A and 7B where Vgd<0 and Vgs<0.

Next, the driving capability of the TFT when the threshold voltage of the TFT is shifted toward the lower side will be described with reference to FIG. 9. In FIG. 9, reference numeral 300 designates the Vg-Id curve described above before the threshold voltage is shifted, and 500 designates a Vg-Id curve after the threshold voltage is shifted toward the lower side. In this case, at Vg=V1, the current Id obtained in the curve 500 is increased from the current Id obtained in the curve 300 by a shift amount of ΔI3. Therefore, it can be said that the driving capability of the TFT of the curve 500 in which the threshold voltage was shifted is improved from that of the curve 300.

That is, the driving capability of the TFT when the threshold voltage of the TFT is shifted toward the lower side corresponds to the driving capability as shown by the Vg-Id curve 500 in FIG. 9, which shows the Vg-Id curve of the a-Si TFT, in which the horizontal axis represents Vg, and the vertical axis represents Id. As shown in FIG. 9, the Vg-Id curve 300 is shifted to the Vg-Id curve 500 along the horizontal axis Vg in the negative direction denoted by a solid arrow. As a result, even when the same voltage (for example, a voltage V1 is applied to the gate terminal, Vg=V1) was applied to the gate terminal, as shown in FIG. 9, the current Id flowing between the drain and source increases by an amount of ΔI3, and the driving capability is improved by an amount of ΔI3. That is, the driving capability of the TFT in which the threshold voltage was shifted toward the lower side, and which exhibits characteristics such as the Vg-Id curve 500 will be improved compared to that of the Vg-Id curve 300.

Figure 10:
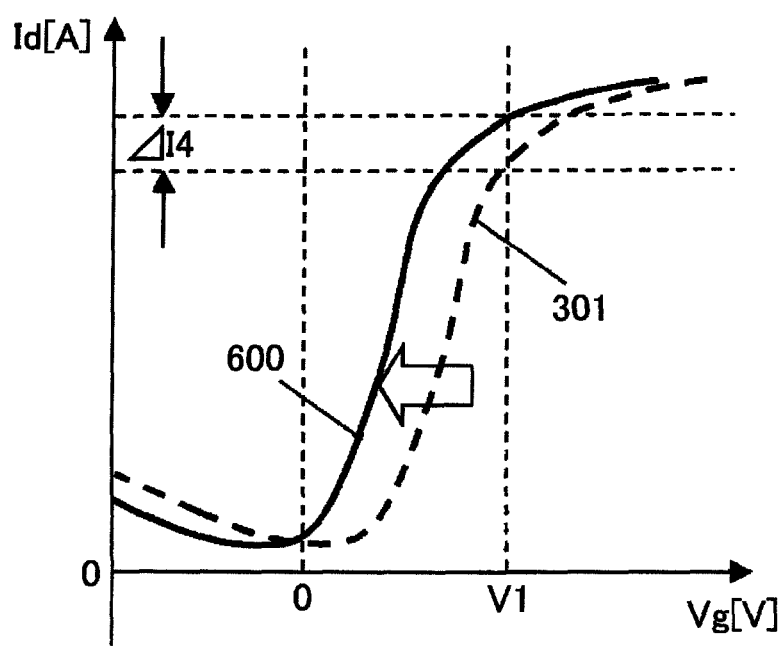
FIG. 10 is a diagram illustrating the ideal TFT characteristics when coping with the threshold voltage shift.

By taking advantage of the TFT characteristics, in the present embodiment, even when the threshold voltage of the TFT is shifted toward the higher side, by applying a reverse bias between the drain or gate and source terminals, the shift amount of the threshold voltage of the TFT is suppressed. That is, the ideal TFT characteristics when coping with a threshold voltage shift as shown in FIG. 10 are realized by the shift register circuit according to the first embodiment. In the shift register circuit according to the first embodiment, characteristics such as a Vg-Id curve 600 are realized by shifting the Vg-Id curve 301 toward the lower side of the horizontal axis by a voltage application method shown in FIGS. 7A and 7B or FIGS. 8A and 8B. That is to say, as for a shift amount wherein the threshold voltage of the TFT is shifted toward the higher side, by accelerating a reverse-directional shift, a decrease in the driving capability of the TFT is obviated.

Figure 2:
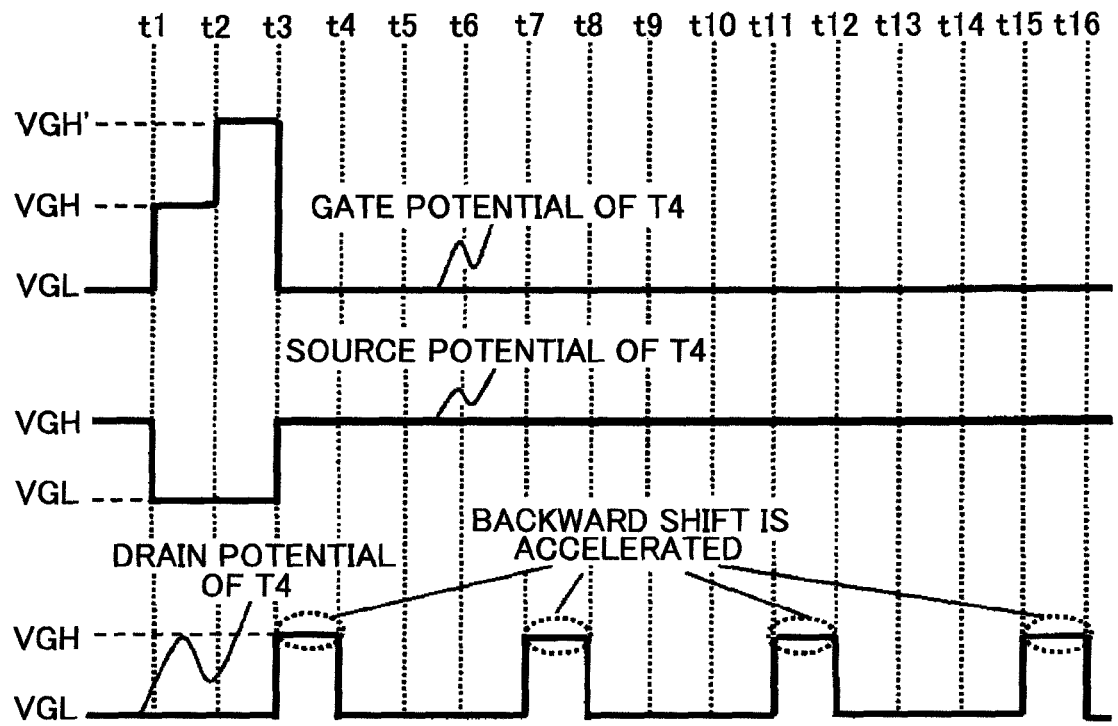
FIG. 2 is a diagram illustrating an operation of the main part of the shift register circuit in the display apparatus according to the first embodiment of the present invention.

FIGS. 1 and 2 are diagrams illustrating a main part of the shift register circuit in the display apparatus according to the first embodiment of the present invention. Hereinafter, an application example of the threshold voltage shift to the shift register circuit will be described with reference to FIGS. 1 and 2. Specifically, FIG. 1 illustrates a schematic configuration of the main part of the shift register circuit in the display apparatus according to a first embodiment of the present invention, and FIG. 2 illustrates an operation of the main part of the shift register circuit in the display apparatus according to the first embodiment of the present invention. The transistors T4 and T5 and the capacitor elements C1 and C2 shown in FIGS. 1 and 2 have the same configuration as that in the shift register circuit according to the first embodiment shown in FIG. 15.

As shown in FIG. 1, in the shift register circuit according to the first embodiment, the present invention is applied to the transistor T4 in which the gate terminal is connected to the first potential node N1, the source terminal is connected to the second potential node N2, and the drain terminal is connected to the wiring 803, whereby a decrease in the driving capability of the transistor T4 is obviated.

As shown in FIG. 2, the shift register circuit according to the first embodiment obviates a decrease in the driving capability of the transistor T4 due to a shift of the threshold voltage toward a higher side in the following manner. That is, although during the periods t2 to t3, the potentials of the drain and source terminals of the transistor T4 decrease to be lower than the potential of the gate terminal of the transistor T4, namely the potential of the first potential node N1, the drain terminal of the transistor T4 is connected to the wiring 803. With this configuration, during the periods (periods excluding the periods t1 to t3) where the potential of the source terminal of the transistor T4 is equal to or higher than the VGH level, the drain terminal of the transistor T4 can have the VGH level during the periods t3 to t4 which correspond to the 2H periods of the 8H periods. As a result, compared to the case where the drain terminal of the transistor T4 is connected to the wiring 800 that outputs the constant VGL level with respect to the time axis, it is possible to accelerate a shift of the threshold voltage of the transistor T4 in the backward direction, namely in a direction of decreasing the threshold voltage. Moreover, it is possible to reduce a shift of the threshold voltage of the transistor T4 in a direction of increasing the threshold voltage.

That is to say, in the shift register according to the first embodiment, in order to stably control the transistor T5 controlled by the first potential node N1, the wiring 803 is connected to the drain terminal of the transistor T4, and the clock potential signal is input from the wiring 803 so that, when it is assumed that the voltage applied to the gate terminal of the transistor T4 (third element) that controls the first potential node N1 and the second potential node N2 so as to have opposite potential levels is A, the voltage applied to the source terminal is B, and the voltage applied to the drain terminal is C, voltages are applied to the transistor T4 in such a way that a state of A>B and A>C and a state of A<B and A<C, or a state of A>B and A<C and a state of A<B and A>C, or a state of A<B and A>C and a state of A>B and A<C are switched alternately.

Second Embodiment

Figure 17:
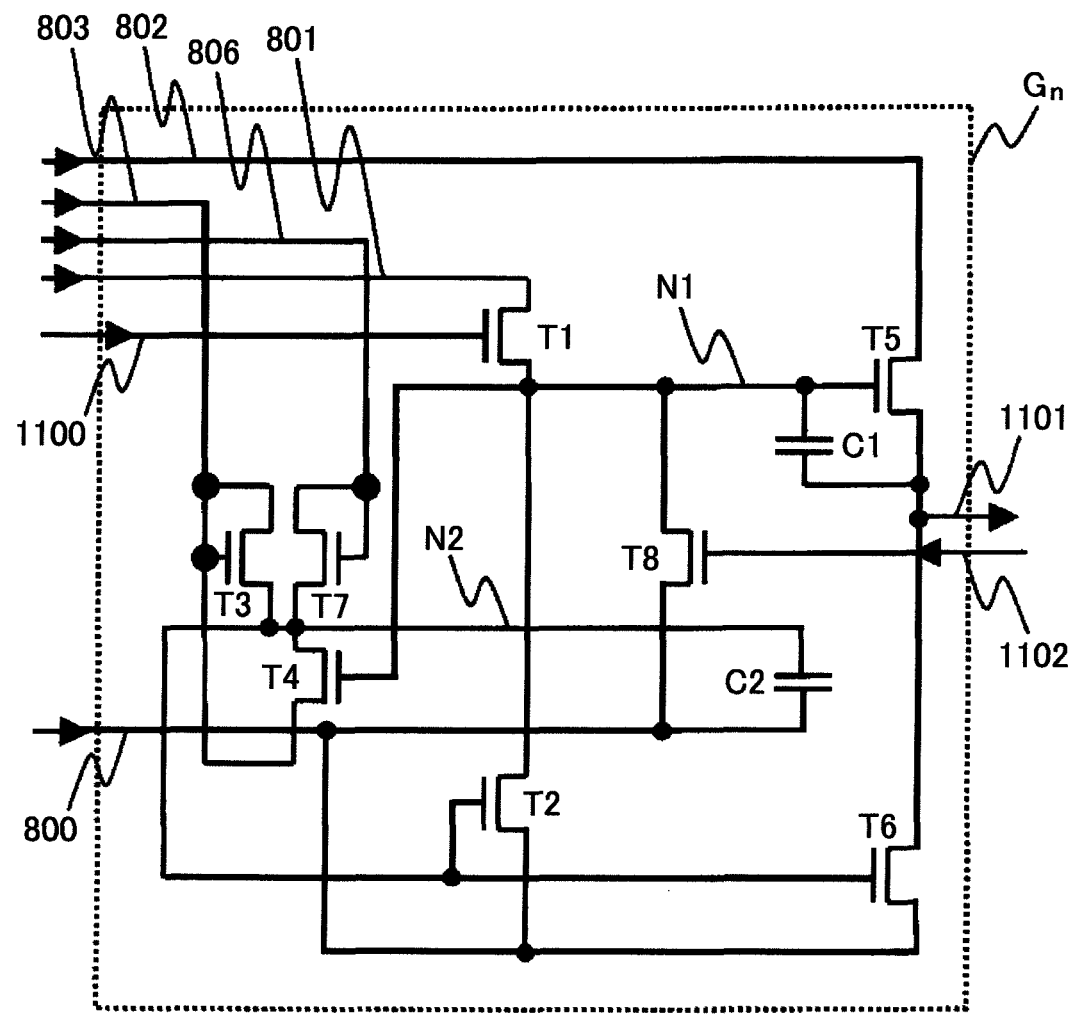
FIG. 17 is a diagram illustrating a schematic configuration of a shift register circuit in a display apparatus according to a second embodiment of the present invention.
Figure 18:
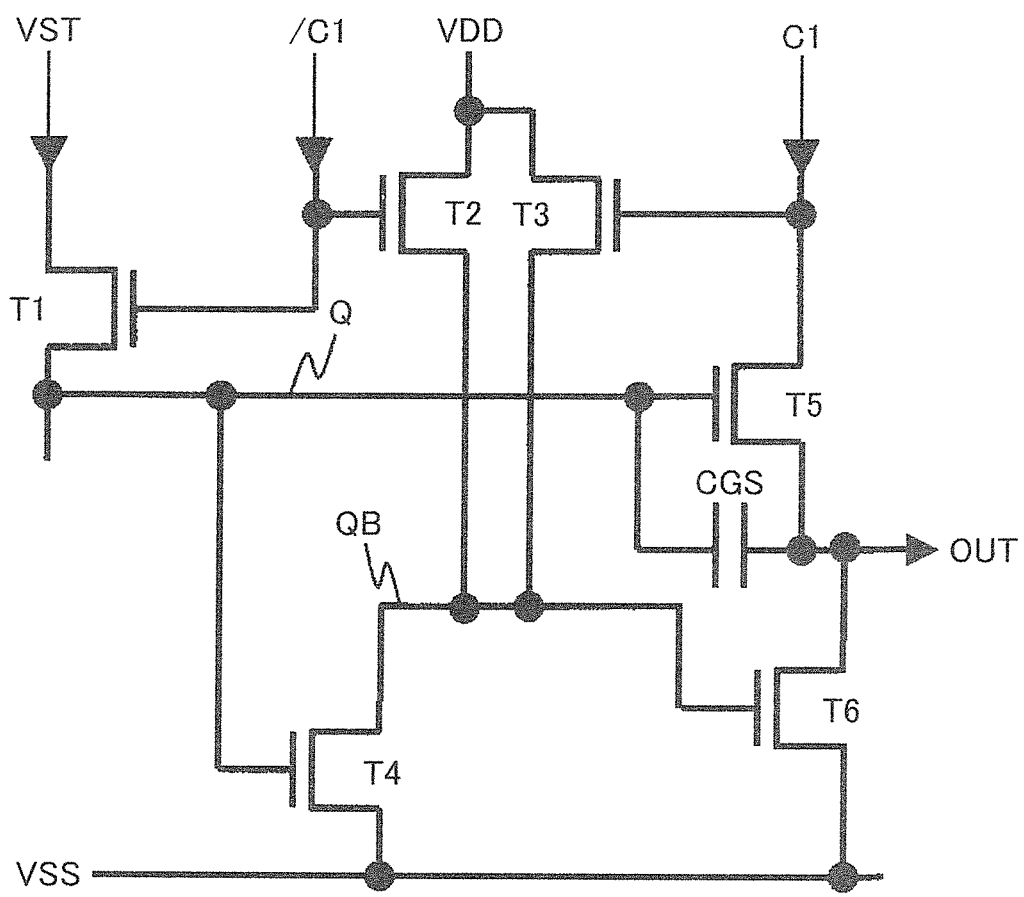
FIG. 18 is a diagram illustrating a schematic configuration of a shift register circuit according to the related art.

FIG. 17 is a diagram illustrating a schematic configuration of a shift register circuit in a display apparatus according to a second embodiment of the present invention. The configuration of the shift register circuit according to the second embodiment is the same as that of the first embodiment, except for the configuration of the transistors T3 and T7. Accordingly, in the following description, the configuration of the transistors T3 and T7 will be described in detail.

As is clear from FIG. 17, in the shift register circuit according to the second embodiment, the transistor T3 has a configuration in which the gate and drain terminals are connected to the wiring 803 to which the second clock signal is applied, and the source terminal is connected to the second potential node N2. Moreover, the transistor T7 has a configuration in which the gate and drain terminals are connected to the wiring 806 to which the start pulse signal is applied, and the source terminal is connected to the second potential node N2.

In the shift register circuit according to the second embodiment, the transistors T3 and T7 have a diode structure in which the drain and gate terminals are connected, whereby a shift of the threshold voltage toward the lower side is suppressed. This is because, when the potentials of the gate terminals of the transistors T3 and T7 are in the VGL level, the drain terminals thereof are also in the VGL level. Thus, a shift amount of the threshold voltage toward the lower side is reduced. As a result, in addition to the effects of the shift register circuit according to the first embodiment described above, in the shift register circuit according to the second embodiment, it is possible to suppress a leak current flowing through the transistors T3 and T7 and suppress an increase in power consumption.

That is to say, in the shift register circuit according to the first embodiment, the threshold voltages of the transistors T3 and T7 are shifted greatly toward the lower side. This is because, as for the transistors T3 and T7, the period where the potential of the gate terminal is lower than the potentials of the drain and source terminals is long. In general, when the threshold voltage of a transistor is shifted toward the lower side, the value of Ids is large even at the time of Vgs=0 [V]. That is, the leak current increases. As a result, there is a possibility that at the output timing of the gate output signal, a leak current flows through the transistors T3 and T7, thus increasing the power consumption. There is also a possibility that the potential of the second potential node N2 starts rising to the VGH level, and the gate output signal disappears.

In the shift register circuit according to the second embodiment, even when only one of the transistors T3 and T7 has the above-described diode structure, since the leak current of the transistor having the diode structure can be suppressed, it is possible to suppress an increase in the power consumption.

As described above, by using the shift register circuit according to the second embodiment, it is possible to suppress an increase in the power consumption and obtain a stable gate output signal.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display apparatus comprising:
   a display panel including,
      a plurality of video signal lines,
      a plurality of scanning signal lines intersecting the video signal lines, and
      a thin-film transistor which is formed near each intersection of the scanning signal lines and the video signal lines, where a pixel region is defined in a region surrounded by a pair of adjacent scanning signal lines and a pair of adjacent video signal lines; and
   a scanning signal line driver circuit which is formed on the same board as the display panel so as to sequentially apply a select signal to the scanning signal lines,
   wherein the scanning signal line driver circuit is connected to a plurality of shift registers that outputs an output signal, which is obtained by shifting a start pulse, as a start pulse of a next stage, each of the shift registers including,
      a first element controlled by a first potential node to supply a first driving voltage to an output terminal,
      a second element controlled by a second potential node to supply a second driving voltage lower than the first driving voltage to the output terminal, and
      a third element for controlling the first potential node and the second potential node so as to have opposite potential levels, and
   wherein when it is assumed that a voltage applied to a gate terminal of the third element is A, a voltage applied to a first terminal thereof is B, a voltage applied to a second terminal thereof is C, voltages are applied to the third element so that a state of A>B and A>C and a state of A<B and A<C, or a state of A>B and A<C and a state of A<B and A>C, or a state of A<B and A>C and a state of A>B and A<C are switched alternately.

2. The display apparatus according to claim 1, wherein the second potential node is connected to a gate terminal of the second element, the first or second terminal of the third element is connected to the second potential node.

3. The display apparatus according to claim 1, wherein gate terminals of the first and third elements are connected to the first potential node.

4. A display apparatus comprising:
   a display panel including,
      a plurality of video signal lines,
      a plurality of scanning signal lines intersecting the video signal lines, and
      a thin-film transistor which is formed near each intersection of the scanning signal lines and the video signal lines, where a pixel region is defined in a region surrounded by a pair of adjacent scanning signal lines and a pair of adjacent video signal lines; and
   a scanning signal line driver circuit which is formed on the same board as the display panel so as to sequentially apply a select signal to the scanning signal lines,
   wherein the scanning signal line driver circuit is connected to a plurality of shift registers that outputs an output signal, which is obtained by shifting a start pulse based on first and second clock signals, as a start pulse of a next stage, each of the shift registers including,
      a first element controlled by a first potential node to supply a first driving voltage to an output terminal,
      a second element controlled by a second potential node to supply a second driving voltage lower than the first driving voltage to the output terminal, and
      a third element for controlling the first potential node and the second potential node so as to have opposite potential levels,
   wherein one of first and second terminals of the third element is connected to the second potential node, and the other terminal is connected to an input terminal of the second clock signal, and
   wherein the second clock signal is input to the other terminal.

5. The display apparatus according to claim 4, wherein gate terminals of the first and third elements are connected to the first potential node.

6. The display apparatus according to claim 5, wherein a gate terminal of the second element is connected to the second potential node.

7. A display apparatus comprising:
   a display panel including,
      a plurality of video signal lines,
      a plurality of scanning signal lines intersecting the video signal lines, and
      a thin-film transistor which is formed near each intersection of the scanning signal lines and the video signal lines, where a pixel region is defined in a region surrounded by a pair of adjacent scanning signal lines and a pair of adjacent video signal lines; and
   a scanning signal line driver circuit which is formed on the same board as the display panel so as to sequentially apply a select signal to the scanning signal lines,
   wherein the scanning signal line driver circuit is connected to a plurality of shift registers that outputs an output signal, which is obtained by shifting a start pulse based on first and second clock signals, as a start pulse of a next stage, each of the shift registers including,
      a transistor element (T5) controlled by a first potential node to supply a first driving voltage to an output terminal,
      a transistor element (T6) controlled by a second potential node to supply a second driving voltage lower than the first driving voltage to the output terminal, a transistor element (T4) for controlling the first potential node and the second potential node so as to have opposite potential levels, a transistor element (T3) for supplying a fixed high potential to the second potential node in response to an input of the first clock signal, a transistor element (T1) for supplying a fixed high potential to the first potential node in response to an input of the start pulse, a transistor element (T8) for supplying a fixed low potential to the first potential node in response to a shift output of a next stage, a transistor element (T2) controlled by the second potential node to supply a fixed low potential to the first potential node, and a retention capacitor retaining the potential of the second potential node.

8. The display apparatus according to claim 7, wherein an output period of the select signal is M line periods (where M is a natural number), and a high voltage of a select signal of a present stage is overlapped or is not overlapped with a high voltage of a select signal of a previous stage.

* * * * *